United States Patent
Arena-Foster et al.

(10) Patent No.: US 7,044,662 B2
(45) Date of Patent: May 16, 2006

(54) DEVELOPING PHOTORESIST WITH SUPERCRITICAL FLUID AND DEVELOPER

(75) Inventors: Chantal J. Arena-Foster, Mesa, AZ (US); Allan Wendell Awtrey, Forth Worth, TX (US); Nicholas Alan Ryza, Austin, TX (US); Paul Schilling, Granite Bay, CA (US)

(73) Assignee: Tokyo Electron Limited, Tokyo (JP)

( * ) Notice: Subject to any disclaimer, the term of this patent is extended or adjusted under 35 U.S.C. 154(b) by 83 days.

(21) Appl. No.: 10/911,085

(22) Filed: Aug. 3, 2004

(65) Prior Publication Data

US 2005/0008980 A1    Jan. 13, 2005

Related U.S. Application Data

(62) Division of application No. 10/367,078, filed on Feb. 14, 2003.

(60) Provisional application No. 60/357,756, filed on Feb. 15, 2002.

(51) Int. Cl.
*G03D 5/00*    (2006.01)

(52) U.S. Cl. .......................... 396/611; 396/627; 134/1; 134/3; 134/31

(58) Field of Classification Search ................ 355/30, 355/53, 77; 430/311, 322; 134/2, 3, 36, 134/30, 34, 37, 902, 906
See application file for complete search history.

(56) References Cited

U.S. PATENT DOCUMENTS

| | | | |
|---|---|---|---|
| 2,439,689 A | 4/1948 | Hyde et al. ................. | 117/124 |
| 2,617,719 A | 11/1952 | Stewart ....................... | 23/312 |
| 3,642,020 A | 2/1972 | Payne ........................ | 137/112 |
| 3,890,176 A | 6/1975 | Bolon ......................... | 156/2 |
| 3,900,551 A | 8/1975 | Bardoncelli et al. ........... | 423/9 |
| 4,219,333 A | 8/1980 | Harris ........................ | 8/137 |
| 4,341,592 A | 7/1982 | Shortes et al. .............. | 156/643 |
| 4,349,415 A | 9/1982 | DeFilippi et al. ............. | 203/14 |
| 4,475,993 A | 10/1984 | Blander et al. ........... | 204/64 T |
| 4,749,440 A | 6/1988 | Blackwood et al. ........ | 156/646 |
| 4,838,476 A | 6/1989 | Rahn ........................ | 228/180.1 |
| 4,877,530 A | 10/1989 | Moses ........................ | 210/511 |
| 4,879,004 A | 11/1989 | Oesch et al. ................ | 203/89 |
| 4,923,828 A | 5/1990 | Gluck et al. ................ | 437/225 |
| 4,925,790 A | 5/1990 | Blanch et al. ................ | 435/52 |

(Continued)

FOREIGN PATENT DOCUMENTS

DE      39 04 514 C2     8/1990

(Continued)

OTHER PUBLICATIONS

J.B. Rubin et al. "A Comparison of Chilled DI Water/Ozone and Co2-Based Supercritical Fluids as Replacements for Photoresist-Stripping Solvents", IEEE/CPMT Int'l Electronics Manufacturing Technology Symposium, 1998, pp. 308-314.

(Continued)

*Primary Examiner*—D. Rutledge
(74) *Attorney, Agent, or Firm*—Haverstock & Owens LLP

(57) ABSTRACT

An apparatus for developing a polymeric film without the need for a water rinse step is disclosed. An object having a surface supporting a polymeric film is placed onto a support region within a pressure chamber of the apparatus. A fluid and developer is introduced into the pressure chamber and the object is processed at supercritical conditions to develop the polymeric film such that the polymeric film is not substantially deformed. The pressure chamber is then vented.

22 Claims, 3 Drawing Sheets

U.S. PATENT DOCUMENTS

| | | | |
|---|---|---|---|
| 4,933,404 A | 6/1990 | Beckman et al. | 526/207 |
| 4,944,837 A | 7/1990 | Nishikawa et al. | 156/646 |
| 5,011,542 A | 4/1991 | Weil | 134/38 |
| 5,013,366 A | 5/1991 | Jackson et al. | 134/1 |
| 5,068,040 A | 11/1991 | Jackson | 210/748 |
| 5,071,485 A | 12/1991 | Matthews et al. | 134/2 |
| 5,091,207 A | 2/1992 | Tanaka | 427/8 |
| 5,105,556 A | 4/1992 | Kurokawa et al. | 34/12 |
| 5,158,704 A | 10/1992 | Fulton et al. | 252/309 |
| 5,174,917 A | 12/1992 | Monzyk | 252/60 |
| 5,185,058 A | 2/1993 | Cathey, Jr. | 156/656 |
| 5,185,296 A | 2/1993 | Morita et al. | 437/229 |
| 5,196,134 A | 3/1993 | Jackson | 252/103 |
| 5,201,960 A | 4/1993 | Starov | 134/11 |
| 5,213,619 A | 5/1993 | Jackson et al. | 134/1 |
| 5,215,592 A | 6/1993 | Jackson | 134/1 |
| 5,225,173 A | 7/1993 | Wai | 423/2 |
| 5,236,602 A | 8/1993 | Jackson | 210/748 |
| 5,237,824 A | 8/1993 | Pawliszyn | 62/51.1 |
| 5,238,671 A | 8/1993 | Matson et al. | 423/397 |
| 5,250,078 A | 10/1993 | Saus et al. | 8/475 |
| 5,261,965 A | 11/1993 | Moslehi | 134/1 |
| 5,266,205 A | 11/1993 | Fulton et al. | 210/639 |
| 5,269,815 A | 12/1993 | Schlenker et al. | 8/475 |
| 5,269,850 A | 12/1993 | Jackson | 134/2 |
| 5,274,129 A | 12/1993 | Natale et al. | 549/349 |
| 5,285,352 A | 2/1994 | Pastore et al. | 361/707 |
| 5,288,333 A | 2/1994 | Tanaka et al. | 134/31 |
| 5,290,361 A | 3/1994 | Hayashida et al. | 134/2 |
| 5,294,261 A | 3/1994 | McDermott et al. | 134/7 |
| 5,298,032 A | 3/1994 | Schlenker et al. | 8/475 |
| 5,304,515 A | 4/1994 | Morita et al. | 437/231 |
| 5,306,350 A | 4/1994 | Hoy et al. | 134/22.14 |
| 5,312,882 A | 5/1994 | DeSimone et al. | 526/201 |
| 5,314,574 A | 5/1994 | Takahashi | 156/646 |
| 5,316,591 A | 5/1994 | Chao et al. | 134/34 |
| 5,320,742 A | 6/1994 | Fletcher et al. | 208/89 |
| 5,328,722 A | 7/1994 | Ghanayem et al. | 427/250 |
| 5,334,332 A | 8/1994 | Lee | 252/548 |
| 5,334,493 A | 8/1994 | Fujita et al. | 430/463 |
| 5,352,327 A | 10/1994 | Witowski | 156/646 |
| 5,356,538 A | 10/1994 | Wai et al. | 210/634 |
| 5,364,497 A | 11/1994 | Chau et al. | 156/645 |
| 5,370,740 A | 12/1994 | Chao et al. | 134/1 |
| 5,370,741 A | 12/1994 | Bergman | 134/3 |
| 5,370,742 A | 12/1994 | Mitchell et al. | 134/10 |
| 5,401,322 A | 3/1995 | Marshall | 134/13 |
| 5,403,621 A | 4/1995 | Jackson et al. | 427/255.1 |
| 5,403,665 A | 4/1995 | Alley et al. | 428/447 |
| 5,417,768 A | 5/1995 | Smith, Jr. et al. | 134/10 |
| 5,456,759 A | 10/1995 | Stanford, Jr. et al. | 134/1 |
| 5,470,393 A | 11/1995 | Fukazawa | 134/3 |
| 5,474,812 A | 12/1995 | Truckenmuller et al. | 427/430.1 |
| 5,482,564 A | 1/1996 | Douglas et al. | 134/18 |
| 5,486,212 A | 1/1996 | Mitchell et al. | 8/142 |
| 5,494,526 A | 2/1996 | Paranjpe | 134/1 |
| 5,500,081 A | 3/1996 | Bergman | 156/646.1 |
| 5,501,761 A | 3/1996 | Evans et al. | 156/344 |
| 5,514,220 A | 5/1996 | Wetmore et al. | 134/22.18 |
| 5,522,938 A | 6/1996 | O'Brien | 134/1 |
| 5,547,774 A | 8/1996 | Gimzewski et al. | 428/694 ML |
| 5,550,211 A | 8/1996 | DeCrosta et al. | 528/480 |
| 5,580,846 A | 12/1996 | Hayashida et al. | 510/175 |
| 5,589,082 A | 12/1996 | Lin et al. | 216/2 |
| 5,589,105 A | 12/1996 | DeSimone et al. | 252/351 |
| 5,629,918 A | 5/1997 | Ho et al. | 369/112 |
| 5,632,847 A | 5/1997 | Ohno et al. | 156/344 |
| 5,635,463 A | 6/1997 | Muraoka | 510/175 |
| 5,637,151 A | 6/1997 | Schulz | 134/2 |
| 5,641,887 A | 6/1997 | Beckman et al. | 546/26.2 |
| 5,656,097 A | 8/1997 | Olesen et al. | 134/1 |
| 5,665,527 A | 9/1997 | Allen et al. | 430/325 |
| 5,676,705 A | 10/1997 | Jureller et al. | 8/142 |
| 5,679,169 A | 10/1997 | Gonzales et al. | 134/1.3 |
| 5,679,171 A | 10/1997 | Saga et al. | 134/3 |
| 5,683,473 A | 11/1997 | Jureller et al. | 8/142 |
| 5,683,977 A | 11/1997 | Jureller et al. | 510/286 |
| 5,688,879 A | 11/1997 | DeSimone | 526/89 |
| 5,700,379 A | 12/1997 | Biebl | 216/2 |
| 5,714,299 A | 2/1998 | Combes et al. | 430/137 |
| 5,725,987 A | 3/1998 | Combes et al. | 430/137 |
| 5,726,211 A | 3/1998 | Hedrick et al. | 521/61 |
| 5,730,874 A | 3/1998 | Wai et al. | 210/638 |
| 5,736,425 A | 4/1998 | Smith et al. | 438/778 |
| 5,739,223 A | 4/1998 | DeSimone | 526/89 |
| 5,766,367 A | 6/1998 | Smith et al. | 134/2 |
| 5,783,082 A | 7/1998 | DeSimone et al. | 210/634 |
| 5,797,719 A | 8/1998 | James et al. | 417/46 |
| 5,798,438 A | 8/1998 | Sawan et al. | 528/483 |
| 5,804,607 A | 9/1998 | Hedrick et al. | 521/64 |
| 5,807,607 A | 9/1998 | Smith et al. | 427/96 |
| 5,847,443 A | 12/1998 | Cho et al. | 257/632 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,872,061 A | 2/1999 | Lee et al. | 438/705 |
| 5,872,257 A | 2/1999 | Beckman et al. | 546/336 |
| 5,873,948 A | 2/1999 | Kim | 134/19 |
| 5,881,577 A | 3/1999 | Sauer et al. | 68/5 |
| 5,888,050 A | 3/1999 | Fitzgerald et al. | 417/46 |
| 5,893,756 A | 4/1999 | Berman et al. | 438/692 |
| 5,896,870 A | 4/1999 | Huynh et al. | 134/1.3 |
| 5,900,354 A | 5/1999 | Batchelder | 430/395 |
| 5,904,737 A | 5/1999 | Preston et al. | 8/158 |
| 5,908,510 A | 6/1999 | McCullough et al. | 134/2 |
| 5,928,389 A | 7/1999 | Jevtic | 29/25.01 |
| 5,932,100 A | 8/1999 | Yager et al. | 210/634 |
| 5,944,996 A | 8/1999 | DeSimone et al. | 210/634 |
| 5,955,140 A | 9/1999 | Smith et al. | 427/96 |
| 5,965,025 A | 10/1999 | Wai et al. | 210/634 |
| 5,976,264 A | 11/1999 | McCullough et al. | 134/2 |
| 5,980,648 A | 11/1999 | Adler | 134/34 |
| 5,992,680 A | 11/1999 | Smith | 220/812 |
| 5,994,696 A | 11/1999 | Tai et al. | 250/288 |
| 6,005,226 A | 12/1999 | Aschner et al. | 219/390 |
| 6,017,820 A | 1/2000 | Ting et al. | 438/689 |
| 6,021,791 A | 2/2000 | Dryer et al. | 134/100.1 |
| 6,024,801 A | 2/2000 | Wallace et al. | 134/1 |
| 6,037,277 A | 3/2000 | Masakara et al. | 438/787 |
| 6,063,714 A | 5/2000 | Smith et al. | 438/778 |
| 6,067,728 A | 5/2000 | Farmer et al. | 34/470 |
| 6,099,619 A | 8/2000 | Lansbarkis et al. | 95/118 |
| 6,100,198 A | 8/2000 | Grieger et al. | 438/692 |
| 6,110,232 A | 8/2000 | Chen et al. | 29/25.01 |
| 6,114,044 A | 9/2000 | Houston et al. | 428/447 |
| 6,128,830 A | 10/2000 | Bettcher et al. | 34/404 |
| 6,140,252 A | 10/2000 | Cho et al. | 438/781 |
| 6,149,828 A | 11/2000 | Vaartstra | 216/57 |
| 6,171,645 B1 | 1/2001 | Smith et al. | 427/96 |
| 6,200,943 B1 | 3/2001 | Romack et al. | 510/285 |
| 6,216,364 B1 | 4/2001 | Tanaka et al. | 34/448 |
| 6,224,774 B1 | 5/2001 | DeSimone et al. | 210/634 |
| 6,228,563 B1 | 5/2001 | Starov et al. | 430/327 |
| 6,228,826 B1 | 5/2001 | DeYoung et al. | 510/291 |
| 6,232,238 B1 | 5/2001 | Chang et al. | 438/725 |
| 6,232,417 B1 | 5/2001 | Rhodes et al. | 526/171 |
| 6,239,038 B1 | 5/2001 | Wen | 438/745 |
| 6,242,165 B1 | 6/2001 | Vaartstra | 430/329 |
| 6,251,250 B1 | 6/2001 | Keigler | 205/89 |
| 6,255,732 B1 | 7/2001 | Yokoyama et al. | 257/760 |
| 6,270,531 B1 | 8/2001 | DeYoung et al. | 8/142 |
| 6,270,948 B1 | 8/2001 | Sato et al. | 430/314 |
| 6,277,753 B1 | 8/2001 | Mullee et al. | 438/692 |
| 6,284,558 B1 | 9/2001 | Sakamoto | 438/30 |

| | | | |
|---|---|---|---|
| 6,286,231 B1 | 9/2001 | Bergman et al. | 34/410 |
| 6,306,564 B1 | 10/2001 | Mullee | 430/329 |
| 6,319,858 B1 | 11/2001 | Lee et al. | 438/787 |
| 6,331,487 B1 | 12/2001 | Koch | 438/692 |
| 6,344,243 B1 | 2/2002 | McClain et al. | 427/388.1 |
| 6,358,673 B1 | 3/2002 | Namatsu | 430/311 |
| 6,361,696 B1 | 3/2002 | Spiegelman et al. | 210/662 |
| 6,367,491 B1 | 4/2002 | Marshall et al. | 134/104.4 |
| 6,380,105 B1 | 4/2002 | Smith et al. | 438/778 |
| 6,425,956 B1 | 7/2002 | Cotte et al. | 134/3 |
| 6,436,824 B1 | 8/2002 | Chooi et al. | 438/687 |
| 6,454,945 B1 | 9/2002 | Weigl et al. | 210/634 |
| 6,458,494 B1 | 10/2002 | Song et al. | 430/5 |
| 6,461,967 B1 | 10/2002 | Wu et al. | 438/705 |
| 6,485,895 B1 | 11/2002 | Choi et al. | 430/330 |
| 6,486,078 B1 | 11/2002 | Rangarajan et al. | 438/778 |
| 6,492,090 B1 | 12/2002 | Nishi et al. | 430/270.1 |
| 6,500,605 B1 | 12/2002 | Mullee et al. | 430/329 |
| 6,509,141 B1 | 1/2003 | Mullee | 430/329 |
| 6,537,916 B1 | 3/2003 | Mullee et al. | 438/692 |
| 6,558,475 B1 | 5/2003 | Jur et al. | 134/21 |
| 6,562,146 B1 | 5/2003 | DeYoung et al. | 134/30 |
| 6,641,678 B1 * | 11/2003 | DeYoung et al. | 134/3 |
| 6,736,149 B1 * | 5/2004 | Biberger et al. | 134/66 |
| 6,764,552 B1 | 7/2004 | Joyce et al. | 134/3 |
| 2001/0019857 A1 | 9/2001 | Yokoyama et al. | 438/142 |
| 2001/0024247 A1 | 9/2001 | Nakata | 349/43 |
| 2001/0041455 A1 | 11/2001 | Yun et al. | 438/745 |
| 2001/0041458 A1 | 11/2001 | Ikakura et al. | 438/778 |
| 2002/0001929 A1 | 1/2002 | Biberger et al. | 438/584 |
| 2002/0055323 A1 | 5/2002 | McClain et al. | 451/41 |
| 2002/0074289 A1 | 6/2002 | Sateria et al. | 210/664 |
| 2002/0081533 A1 | 6/2002 | Simons et al. | 430/325 |
| 2002/0088477 A1 | 7/2002 | Cotte et al. | 134/2 |
| 2002/0098680 A1 | 7/2002 | Goldstein et al. | 438/625 |
| 2002/0106867 A1 | 8/2002 | Yang et al. | 349/43 |
| 2002/0112740 A1 | 8/2002 | DeYoung et al. | 134/3 |
| 2002/0112746 A1 | 8/2002 | DeYoung et al. | 134/36 |
| 2002/0115022 A1 | 8/2002 | Messick et al. | 430/311 |
| 2002/0117391 A1 | 8/2002 | Bearn | 203/81 |
| 2002/0123229 A1 | 9/2002 | Ono et al. | 438/706 |
| 2002/0127844 A1 | 9/2002 | Grill et al. | 438/622 |
| 2002/0132192 A1 | 9/2002 | Namatsu | 430/322 |
| 2002/0141925 A1 | 10/2002 | Wong et al. | 423/262 |
| 2002/0142595 A1 | 10/2002 | Chiou | 438/689 |
| 2002/0150522 A1 | 10/2002 | Heim et al. | 422/190 |
| 2002/0164873 A1 | 11/2002 | Masuda et al. | 438/689 |
| 2003/0003762 A1 | 1/2003 | Cotte et al. | 438/745 |
| 2003/0008238 A1 | 1/2003 | Goldfarb et al. | 430/272.1 |
| 2003/0008518 A1 | 1/2003 | Chang et al. | 438/745 |
| 2003/0013311 A1 | 1/2003 | Chang et al. | 438/704 |
| 2003/0036023 A1 | 2/2003 | Moreau et al. | 430/324 |
| 2003/0047533 A1 | 3/2003 | Reid et al. | 216/24 |
| 2003/0106573 A1 | 6/2003 | Masuda et al. | 134/26 |
| 2003/0125225 A1 | 7/2003 | Xu et al. | 510/175 |
| 2003/0205510 A1 | 11/2003 | Jackson | 210/86 |
| 2003/0217764 A1 | 11/2003 | Masuda et al. | 134/26 |
| 2004/0020518 A1 | 2/2004 | DeYoung et al. | 134/30 |
| 2004/0087457 A1 | 5/2004 | Korzenski et al. | 510/177 |
| 2004/0103922 A1 | 6/2004 | Inoue et al. | 134/26 |
| 2004/0112409 A1 | 6/2004 | Schilling | 134/26 |
| 2004/0177867 A1 | 9/2004 | Schilling | 134/26 |

FOREIGN PATENT DOCUMENTS

| | | |
|---|---|---|
| DE | 40 04 111 C2 | 8/1990 |
| DE | 39 06 724 C2 | 9/1990 |
| DE | 39 06 735 C2 | 9/1990 |
| DE | 39 06 737 A1 | 9/1990 |
| DE | 44 29 470 A1 | 3/1995 |
| DE | 43 44 021 A1 | 6/1995 |
| EP | 0 283 740 A2 | 9/1988 |
| EP | 0 302 345 A2 | 2/1989 |
| EP | 0 370 233 A1 | 5/1990 |
| EP | 0 391 035 A2 | 10/1990 |
| EP | 0 518 653 B1 | 12/1992 |
| EP | 0 536 752 A2 | 4/1993 |
| EP | 0 572 913 A1 | 12/1993 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| EP | 0 822 583 A2 | 2/1998 |
| EP | 0 829 312 A2 | 3/1998 |
| EP | 0 836 895 A2 | 4/1998 |
| JP | 60-192333 | 9/1985 |
| JP | 1-045131 | 2/1989 |
| JP | 1-246835 | 10/1989 |
| JP | 2-209729 | 8/1990 |
| JP | 2-304941 | 12/1990 |
| JP | 7-142333 | 6/1995 |
| JP | 8-186140 | 7/1996 |
| JP | 8-222508 | 8/1996 |
| WO | WO 90/06189 | 6/1990 |
| WO | WO 90/13675 | 11/1990 |
| WO | WO 93/14255 | 7/1993 |
| WO | WO 93/14259 | 7/1993 |
| WO | WO 93/20116 | 10/1993 |
| WO | WO 96/27704 | 9/1996 |
| WO | WO 99/49998 | 10/1999 |
| WO | WO 00/73241 A1 | 12/2000 |
| WO | WO 01/33613 A2 | 5/2001 |
| WO | WO 02/09894 A2 | 2/2002 |
| WO | WO 02/11191 A2 | 2/2002 |
| WO | WO 02/16051 A2 | 2/2002 |

OTHER PUBLICATIONS

"Los Almos National Laboratory," Solid State Technology, pp. S10 & S14, Oct. 1998.

"Supercritical Carbon Dioxide Resist Remover, SCORR, the Path to Least Photoresistance," Los Alamos National Laboratory, 1998.

Guan, Z. et al., "Fluorocarbon-Based Heterophase Polymeric Materials. I. Block Copolymer Surfactants for Carbon Dioxide Applications," Macromolecules, vol. 27, 1994, pp 5527-5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872-874.

Ziger, D.H. et al., "Compressed Fluid Technology: Application to RIE Developed Resists," AIChE Journal, vol. 33, No. 10, Oct. 1987, pp 1585-1591.

Kirk-Othmer, "Alcohol Fuels to Toxicology," Encyclopedia of Chemical Terminology, 3rd ed., Supplement Volume, New York: John Wiley & Sons, 1984, pp. 872-893.

"Cleaning with Supercritical $CO_2$," NASA Tech Briefs, MFS-29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p. 14.

Takahashi, D., "Los Alamos Lab Finds Way to Cut Chip Toxic Waste," Wall Street Journal, Jun. 22, 1998.

"Supercritical CO2 Process Offers Less Mess from Semiconductor Plants", Chemical Engineering Magazine, pp. 27 & 29, Jul. 1998.

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Jackson, K. et al., "Surfactants and Micromulsions in Supercritical Fluids," Supercritical Fluid Cleaning. Noyes Publications, Westwood, NJ, pp. 87-120, Spring 1998.

Kryszewski, M., "Production of Metal and Semiconductor Nanoparticles in Polymer Systems," Polimery, pp. 65-73, Feb. 1998.

Bakker, G.L. et al., "Surface Cleaning and Carbonaceous Film Removal Using High Pressure, High Temperature Water, and Water/CO2 Mixtures," J. Electrochem. Soc, vol. 145, No. 1, pp. 284-291, Jan. 98.

Ober, C.K. et al., "Imaging Polymers with Supercritical Carbon Dioxide," Advanced Materials, vol. 9, No. 13, 1039-1043, Nov. 3, 1997.

Russick, E.M. et al., "Supercritical Carbon Dioxide Extraction of Solvent from Micro-machined Structures." Supercritical Fluids Extraction and Pollution Prevention, ACS Symposium Series, vol. 670, pp. 255-269,Oct. 21, 1997.

Dahmen, N. et al., "Supercritical Fluid Extraction of Grinding and Metal Cutting Waste Contaminated with Oils," Supercritical Fluids-Extraction and Pollution Prevention, ACS Symposium Series, vol. 670, pp. 270-279, Oct. 21, 1997.

Wai, C.M., "Supercritical Fluid Extraction: Metals as Complexes," Journal of Chromatography A, vol. 785, pp. 369-383, Oct. 17, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Tomioka Y., et al., "Decomposition of Tetramethylammonium (TMA) in a Positive Photo-resist Developer by Supercritical Water," Abstracts of Papers 214th ACS Natl Meeting, American Chemical Society, Abstract No. 108, Sep. 7, 1997.

Klein, H. et al., "Cyclic Organic Carbonates Serve as Solvents and Reactive Diluents," Coatings World, pp. 38-40, May 1997.

Bühler, J. et al., "Linear Array of Complementary Metal Oxide Semiconductor Double-Pass Metal Micro-mirrors," Opt. Eng., vol. 36, No. 5, pp 1391-1398, May 1997.

Jo, M.H. et al., Evaluation of SIO2 Aerogel Thin Film with Ultra Low Dielectric Constant as an Intermetal Dielectric, Microelectronic Engineering, vol. 33, pp. 343-348, Jan. 1997.

McClain, J.B. et al., "Design of Nonionic Surfactants for Supercritical Carbon Dioxide, " Science, vol. 274, Dec. 20, 1996. pp. 2049-2052.

Znaidi, L. et al., "Batch and Semi-Continuous Synthesis of Magnesium Oxide Powders from Hydrolysis and Supercritical Treatment of Mg(OCH3)2," Materials Research Bulletin, vol. 31, No. 12, pp. 1527-1335, Dec. 1996.

Tadros, M.E., "Synthesis of Titanium Dioxide Particles in Supercritical CO2," J. Supercritical Fluids, vol. 9, pp. 172-176, Sep. 1996.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gabor, A, et al., "Block and Random Copolymer resists Designed for 193 nm Lithography and Environmentally Friendly Supercritical CO2 Development,", SPIE, vol. 2724, pp. 410-417, Jun. 1996.

Schimek, G. L. et al., "Supercritical Ammonia Synthesis and Characterization of Four New Alkali Metal Silver Antimony Sulfides . . . ," J. Solid State Chemistry, vol. 123 pp. 277-284, May 1996.

Gallagher-Wetmore, P. et al., "Supercritical Fluid Processing: Opportunities for New Resist Materials and Processes," SPIE, vol. 2725, pp. 289-299, Apr. 1996.

Papathomas, K.I. et al., "Debonding of Photoresists by Organic Solvents," J. Applied Polymer Science, vol. 59, pp. 2029-2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991-1994.

Gloyna, E.F. et al., "Supercritical Water Oxidation Research and Development Update," Environmental Progress, vol. 14, No. 3. Pp. 182-192, Aug. 1995.

Gallagher-Wetmore, P. et al., "Supercritical Fluid Processing: A New Dry Technique for Photoresist Developing," SPIE vol. 2438, pp. 694-708, Jun. 1995.

Gabor, A. H. et al., "Silicon-Containing Block Copolymer Resist Materials," Microelectronics Technology—Polymers for Advanced Imaging and Packaging , ACS Symposium Series, vol. 614, pp. 281-298, Apr. 1995.

Tsiartas, P.C. et al., "Effect of Molecular weight Distribution on the Dissolution Properties of Novolac Blends," SPIE, vol. 2438, pp. 264-271, Jun. 1995.

Allen, R.D. et al., "Performance Properties of Near-monodisperse Novolak Resins,"SPIE, vol. 2438, pp. 250-260, Jun. 1995.

Wood, P.T. et al., "Synthesis of New Channeled Structures in Supercritical Amines . . . ," Inorg. Chem., vol. 33, pp. 1556-1558, 1994.

Jerome, J.E. et al., "Synthesis of New Low-Dimensional Quatemary Compounds . . . ," Inorg. Chem., vol. 33, pp. 1733-1734, 1994.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning using Supercritical Fluids," J. Vac, Sci, Technol. A. vol. 11, No. 4, Jul. 1993, pp. 1696-1701.

Bok, E, et al., "Supercritical Fluids for Single Wafer Cleaning," Solid State Technology, pp. 117-120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019-1022, 1992.

Hansen, B.N. et al., "Supercritical Fluid Transport—Chemical Deposition of Films,"Chem. Mater., vol. 4, No. 4, pp, 749-752, 1992.

Page, S.H. et al., "Predictability and Effect of Phase Behavior of CO2/ Propylene Carbonate in Supercritical Fluid Chromatography," J. Microcol, vol. 3, No. 4, pp. 355-369, 1991.

Brokamp, T. et al., "Synthese und Kristallstruktur Eines Gemischtvalenten Lithium-Tantalnitrids Li2Ta3N5," J. Alloys and Compounds, vol. 176. pp. 47-60, 1991.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D.H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

"Final Report on the Safety Assessment of Propylene Carbonate", J. American College of Toxicology, vol. 6, No. 1, pp. 23-51, 1987.

"Porous Xerogel Films as Ultra-Low Permittivity Dielectrics for ULSI Interconnect Applications", Materials Research Society, pp. 463-469, 1997.

Kawakami et al., "A Super Low-k (k=1.1) Silica Aerogel Film Using Supercritical Drying Technique", IEEE, pp. 143-145, 2000.

R.F. Reidy, "Effects of Supercritical Processing on Ultra Low-K Films", Texas Advanced Technology Programm, Texas Instruments, and the Texas Academy of Mathematics and Science.

Anthony Muscat, "Backend Processing Using Supercritical CO2", University of Arizona.

D. Goldfarb et al., "Aqueous-based Photoresist Drying Using Supercritical Carbon Dioxide to Prevent Pattern Collapse", J. Vacuum Sci. Tech. B 18 (6), 3313 (2000).

H. Namatsu et al., "Supercritical Drying for Water-Rinsed Resist Systems", J. Vacuum Sci. Tech. B 18 (6), 3308 (2000).

N. Sundararajan et al., "Supercritical CO2 Processing for Submicron Imaging of Fluoropolymers", Chem. Mater. 12, 41 (2000).

US 6,001,133, 12/1999, DeYoung et al. (withdrawn)
US 6,486,282, 11/2002, Dammel et al. (withdrawn)

* cited by examiner

DEVELOPING PHOTORESIST WITH SUPERCRITICAL FLUID AND DEVELOPER

RELATED APPLICATIONS

The Application is a Divisional Application of the U.S. patent application Ser. No. 10/367,078, filed Feb. 14, 2003 and titled "DEVELOPING PHOTORESIST WITH SUPERCRITICAL FLUID AND DEVELOPER." The U.S. patent application Ser. No. 10/367,078, filed Feb. 14, 2003 and titled "DEVELOPING PHOTORESIST WITH SUPERCRITICAL FLUID AND DEVELOPER", claims priority under 35 U.S.C. §119(e) from the U.S. Provisional patent application, Ser. No. 60/357,756, filed Feb. 15, 2002 and titled "DRYING RESIST WITH A SOLVENT BATH AND SUPERCRITICAL CO2, AND DEVELOPING RESIST WITH SUPERCRITICAL FLUID AND DISSOLVED TMAH". The U.S. patent application Ser. No. 10/367,078, filed Feb. 14, 2003 and titled "DEVELOPING PHOTORESIST WITH SUPERCRITICAL FLUID AND DEVELOPER", and the Provisional Patent Application, Ser. No. 60/357,756, filed Feb. 15, 2002, titled "DRYING RESIST WITH A SOLVENT BATH AND SUPERCRITICAL CO2, AND DEVELOPING RESIST WITH SUPERCRITICAL FLUID AND DISSOLVED TMAH", are both hereby incorporated by reference.

FIELD OF THE INVENTION

The present invention relates to the field of developing photoresist. More particularly, the present invention relates to the field of developing photoresist, without pattern collapse or deformation, using a supercritical fluid and resist developer.

BACKGROUND OF THE INVENTION

Fabrication of integrated circuits includes the formation of patterned layers on a semiconductor wafer that form electrically active regions in and on the wafer surface. As part of the manufacturing process, a masking process referred to as photolithography or photomasking is used to transfer a pattern onto the wafer. Masking involves applying a photoreactive polymer or photoresist onto the wafer by any suitable means such as by spinning of the wafer to distribute liquid photoresist uniformly on its surface. In a typical semiconductor manufacturing process, several iterations of the masking process are employed. Layers of either positive or negative photoresist can be used in various combinations on the same wafer.

Typically the wafer is heated or "soft baked" on a hot plate to improve adhesion of the resist to the substrate surface. A photo aligner aligns the wafer to the photomask and then portions of the resist coated wafer are exposed to high-energy light so that a pattern is formed as a latent image in the resist layer. A developing agent is then applied to develop the portions of the resist which were exposed. When positive resist is used, the developed portions of the resist are solubilized by the exposure to high-energy light. Conversely, when negative resist is used, the undeveloped portions of the resist are solubilized. Washing and rinsing steps are carried out that selectively remove the solubilized photoresist. A drying step is carried out.

Pattern formation using the traditional lithographic techniques has been carried out using an aqueous solution of tetramethyl ammonium hydroxide (TMAH) as the developer. For example, Takizawa, in U.S. Pat. No. 6,472,127, issued Oct. 29, 2002, discloses a method of forming a resist pattern, including a develop step performed by applying an aqueous solution containing 2.38% TMAH as an alkali developer to the photoresist film. Nishi, et al., in U.S. Pat. No. 6,492,090, issued Dec. 10, 2002, discloses a polymer, a resist composition, and a process for forming a resist pattern. In the method according to Nishi, et al., development is carried out using as the developer an 0.1 to 5% (preferably 2 to 3%) aqueous solution of TMAH, this being done by a conventional method such as dipping, puddling, or spraying.

While mainly used as a developing agent, TMAH has been used as an etchant in semiconductor manufacturing processes. For example, Wu, et al., in U.S. Pat. No. 6,461,967, issued Oct. 8, 2002, discloses a method of removing material from a semiconductor substrate, which includes an etchant containing TMAH to etch silicon-containing material. Makiyama, et al., in U.S. Pat. No. 6,509,252, issued Jan. 21, 2003, discloses a method of manufacturing a semiconductor device, which includes an etching process wherein the etchant is an aqueous solution of TMAH.

It is known that TMAH can be used to assist in the cleaning step of semiconductor manufacturing processes. For example, Nguyen et al., in U.S. Pat. No. 5,597,983, issued Jan. 28, 1997, discloses a method for removing a via sidewall polymer residue formed incident to an etch, wherein a resist developer containing TMAH is used to remove the polymer residue from the via. Chang, et al., in U.S. Pat. No. 6,232,238, issued May 15, 2001, discloses a method for preventing corrosion of a bonding pad resulting from residual polymers on a surface of a semiconductor wafer. In the method according to Chang, et al., an alkaline developer comprising 2.38% TMAH is used for removing the residual polymers.

While TMAH can be used in various steps of semiconductor manufacturing processes, generally it is contained in an aqueous solution. For example, the traditional develop methods utilize a premixed solution of TMAH dissolved in water and dispensed onto the wafer through differently designed nozzles. This leads to distribution, timing issues, and other problems across the wafer that make it difficult to control critical dimensions and other develop defects. When water is used for rinsing, e.g., for resists developed in an aqueous solution of TMAH, the presence of moisture in the atmosphere can not be avoided. This presents a problem because moisture in the atmosphere can cause acrylate-type resist to swell and pattern deformation can occur. The use of water as the developer solvent and rinse agent causes problems because of its high surface tension, ~72 dyn/cm, when compared, e.g., to the surface tension of methanol, ~23 dyn/cm.

It is known that capillary forces scale with the surface tension of the rinse solution. A serious problem emerges when the mechanical stability of the resist lines is too weak to compensate for capillary forces exerted by the rinse liquid during the drying step. During drying, unbalanced capillary forces exert a net force on the pattern that tends to deform the resist lines. When the capillary forces exceed the elastic restoring force of the polymer, collapse of the photoresist structure occurs. As noted in the literature, collapse of photoresist structures is a generic term that refers to the deformation (bending), fracture, and/or peeling of resist from the substrate, in response to capillary forces present during the drying stage of a lithographic process. D. Goldfarb et. al, Aqueous-Based Photoresist Drying Using Supercritical Carbon Dioxide to Prevent Pattern Collapse, J. Vacuum Sci. Tech. B 18(6), 3313 (2000).

This problem of collapse of photoresist structures is exacerbated by high-aspect-ratio resist patterns that are desired as the minimum device feature size decreases. As device feature sizes shrink, the thickness of the resist is constant while the width of the pattern decreases. This results in a higher aspect ratio of height to width of resist lines. In general, as the aspect ratio increases, the mechanical stability of the resist lines decreases. The collapse of high-aspect-ratio photoresist structures is related to the surface tension of the rinse solution (capillary forces scale with the surface tension of the rinse solution) and is a function of both the density (spacing) and aspect ratio of resist lines. The collapse of high-aspect-ratio photoresist structures becomes an increasingly serious problem as semiconductor device feature sizes continue to shrink while relative vertical height increases to accommodate more complex interconnect structures.

There is a need for effective methods for developing the resist layer with no pattern collapse or deformation of the photoresist.

SUMMARY OF THE INVENTION

A first embodiment of the present invention is for a method of developing a polymeric film without the need for a water rinse. An object having a surface supporting a polymeric film is placed onto a support region within a pressure chamber. A fluid and developer is introduced into the pressure chamber and the object is processed at supercritical conditions to develop the polymeric film such that the polymeric film is not substantially deformed. The pressure chamber is then vented.

A second embodiment of the present invention is for a method of developing a polymeric film without the need for a water rinse. An object having a surface supporting a polymeric film is placed onto a support region within a pressure chamber. A fluid and developer chemistry is introduced into the pressure chamber and the object is processed at supercritical conditions to develop the polymeric film such that the polymeric film is not substantially deformed. The pressure chamber is then vented.

A third embodiment of the invention is for an apparatus for developing a polymeric film, without the need for a water rinse, including: a pressure chamber including an object support; means for pressurizing the pressure chamber; means for introducing a fluid and developer into the pressure chamber; means for processing the object at supercritical conditions; and means for venting the pressure chamber.

BRIEF DESCRIPTION OF THE DRAWINGS

The present invention may be better understood by reference to the accompanying drawings of which.

DETAILED DESCRIPTION OF THE PREFERRED EMBODIMENTS

The following detailed description with reference to the accompanying drawing is illustrative of various embodiments of the invention. The present invention should not be construed as limited to the embodiments set forth herein. Therefore, the following detailed description is not to be taken in a limiting sense, and the scope of the present invention is defined by the accompanying claims.

The present invention is directed to a process of developing a polymeric film, such as a photoresist layer on a surface of a semiconductor substrate or wafer that has been fabricated in accordance with methods well known in the art of manufacturing semiconductor devices. The methods in accordance with the present invention utilize the low viscosity and high solvating and solubilizing properties of supercritical fluids, such as supercritical sulfur hexafluoride, to assist in the develop process. The methods in accordance with the present invention eliminate the need for a water rinse step.

For purposes of the invention, "sulfur hexafluoride" should be understood to refer to sulfur hexafluoride ($SF_6$) employed as a fluid in a liquid, gaseous or supercritical (including near-supercritical) state. "Liquid sulfur hexafluoride" refers to $SF_6$ at vapor-liquid equilibrium conditions. If liquid $SF_6$ is used, the temperature employed is preferably below 46° C. "Supercritical sulfur hexafluoride" refers herein to $SF_6$ at conditions above the critical temperature (46° C.) and critical pressure (37 atm). When $SF_6$ is subjected to temperatures and pressures above 46° C. and 37 atm, respectively, it is determined to be in the supercritical state. "Near-supercritical sulfur hexafluoride" refers to $SF_6$ within about 85% of absolute critical temperature and critical pressure.

As used herein, "substrate" includes a wide variety of structures such as semiconductor device structures with a deposited photoresist. A substrate can be a single layer of material, such as a silicon wafer, or can include any number of layers. A substrate can be comprised of various materials, including metals, ceramics, glass, or compositions thereof.

Various polymeric films can be developed using the processes and apparatus of the present invention. The present invention, though applicable to the semiconductor industry, is not limited thereto. For the purposes of the invention, "develop" should be understood to be consistent with its conventional meaning in the art.

Figure 1:
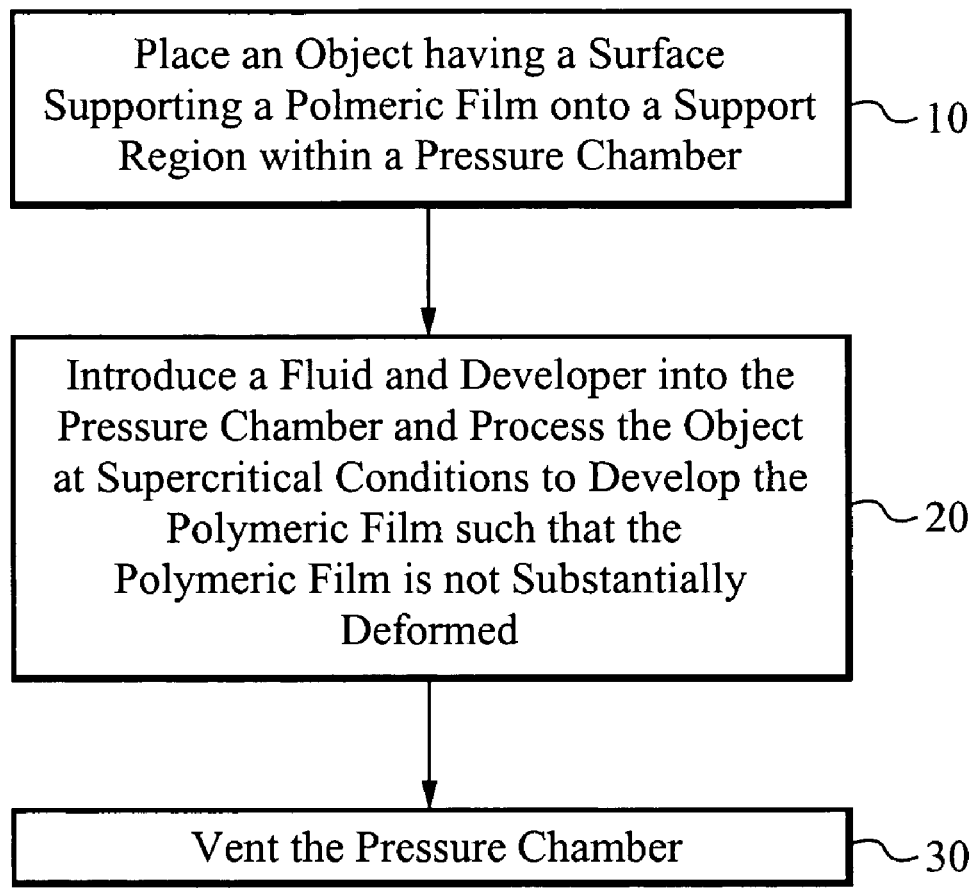
FIG. 1 is a flow chart showing a process flow for a method of developing a polymeric film, without the need for a water rinse step, in accordance with the present invention.

FIG. 1 is a flow chart showing a process flow for a method of developing a polymeric film without the need for a water rinse step. In the preferred embodiment of the present invention, an object having a surface supporting a polymeric film is placed onto a support region within a pressure chamber (10). For purposes of the invention, "object" includes: a substrate including metals, ceramics, glass, and composite mixtures thereof; a semiconductor wafer for forming integrated circuits; and other objects requiring photoresist developing. It should be appreciated that the surface of the object, or at least a portion thereof, is coated with a polymeric film such as photoresist. In one embodiment of the invention, the polymeric film comprises a photoresist that includes high-aspect-ratio photoresist structures.

In the preferred embodiment of the invention, a fluid and developer are introduced into the pressure chamber and the object is processed at supercritical conditions to develop the polymeric film such that the polymeric film is not substantially deformed (20). In a preferred embodiment of the invention, the fluid is sulfur hexafluoride ($SF_6$). The advantages of using $SF_6$ as the fluid in supercritical process include that the critical point is relatively low, it is chemically inert to various photoresists, non flammable, non toxic, non corrosive, and can solubilize organic solvents at moderate pressures. However, it should be understood that the methods and apparatus of the present invention are not limited to the use of $SF_6$ as the fluid.

In a preferred embodiment of the invention, the developer comprises tetramethyl ammonium hydroxide (TMAH). In other embodiments, the developer comprises $R_4AH$ or tetra-R-ammonium hydroxide, where R=aliphatic, aromatic and can be fluorinated or non-fluorinated.

In a preferred embodiment of the invention, processing the object at supercritical conditions to develop the polymeric film includes pressurizing the pressure chamber and recirculating the fluid and developer within the pressure chamber. In one embodiment of the invention, the pressure chamber is pressured with gaseous, liquid, supercritical or near-supercritical $SF_6$. Preferably, the fluid and developer are recirculated within the pressure chamber for a period of time to develop the polymeric film on a surface of the object. In one embodiment, processing the object at supercritical conditions includes spinning the object. The pressure chamber is then vented (30).

Figure 2:
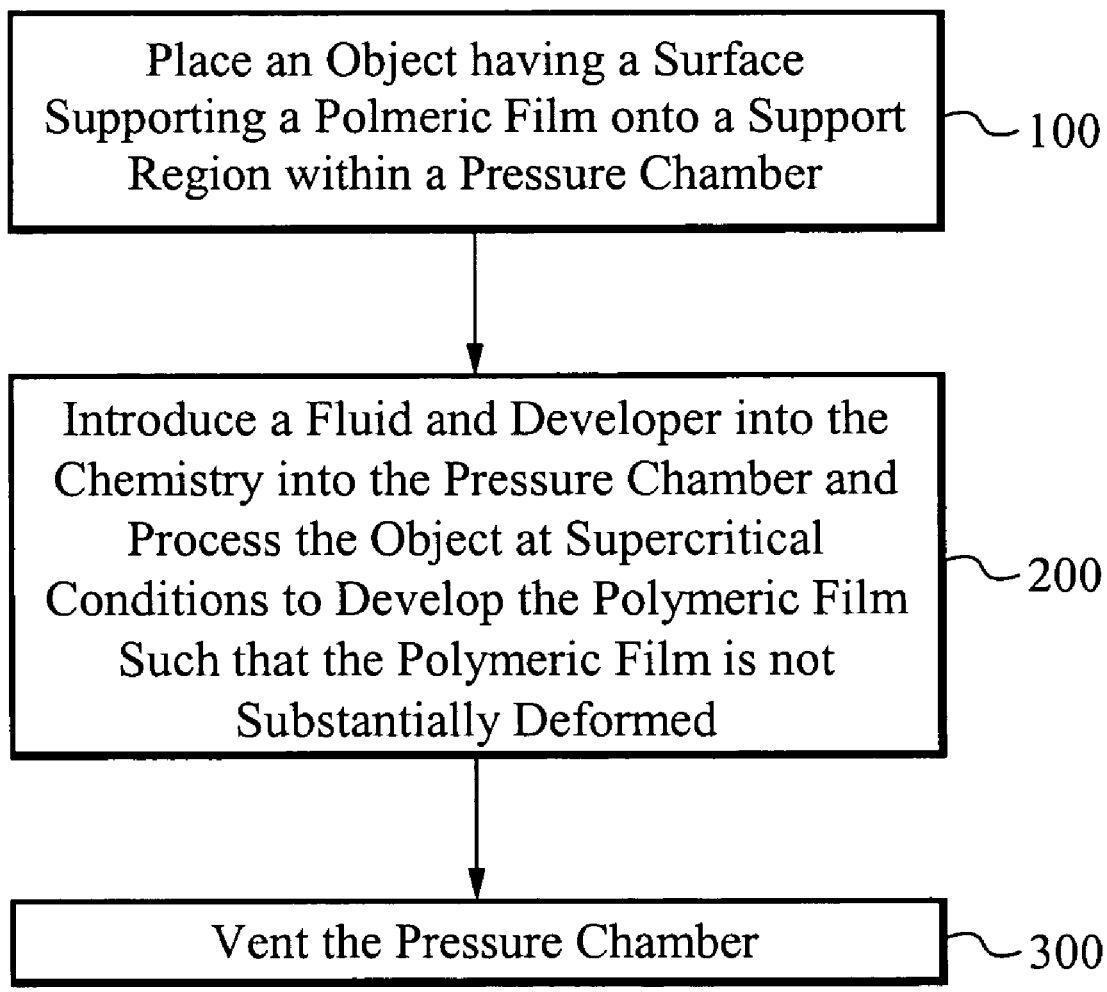
FIG. 2 is a flow chart showing a process flow for a method of developing a polymeric film, without the need for a water rinse step, in accordance with the present invention.

FIG. 2 is a flow chart showing a process flow for a method of developing a polymeric film without the need for a water rinse step. In a preferred embodiment of the present invention, an object having a surface supporting a polymeric film is placed onto a support region within a pressure chamber (100).

In a preferred embodiment of the invention, a fluid and developer chemistry are introduced into the pressure chamber and the object is processed at supercritical conditions to develop the polymeric film such that the polymeric film is not substantially deformed (200). One benefit of a fluid and "developer chemistry" is the ease of changing the developer concentration. In one embodiment of the invention, the developer chemistry comprises a developer dissolved in an inert gas. In one embodiment, the developer comprises TMAH. In one embodiment, the inert gas is $SF_6$.

In one embodiment of the invention, processing the object at supercritical conditions to develop the polymeric film includes pressurizing the pressure chamber and recirculating the fluid and developer chemistry within the pressure chamber. In one embodiment of the invention, the pressure chamber is pressured with gaseous, liquid, supercritical or near-supercritical $SF_6$. Preferably, the fluid and developer chemistry are recirculated within the pressure chamber for a period of time to develop the polymeric film on a surface of the object. The pressure chamber is then vented (300).

A third embodiment of the invention is for an apparatus for developing a polymeric film without the need for a water rinse step. In a preferred embodiment of the present invention, a pressure chamber including an object support is provided. There is means for pressurizing the pressure chamber such as a pump. In a preferred embodiment, means for processing the object at supercritical conditions is provided. The details concerning one example of a pressure chamber for supercritical processing are disclosed in co-owned and co-pending U.S. patent applications, Ser. No. 09/912,844, entitled "HIGH PRESSURE PROCESSING CHAMBER FOR SEMICONDUCTOR SUBSTRATE," filed Jul. 24, 2001, and Ser. No. 09/970,309, entitled "HIGH PRESSURE PROCESSING CHAMBER FOR MULTIPLE SEMICONDUCTOR SUBSTRATES," filed Oct. 3, 2001, which are incorporated by reference. There is means for venting the pressure chamber such as a vent.

Figure 3:
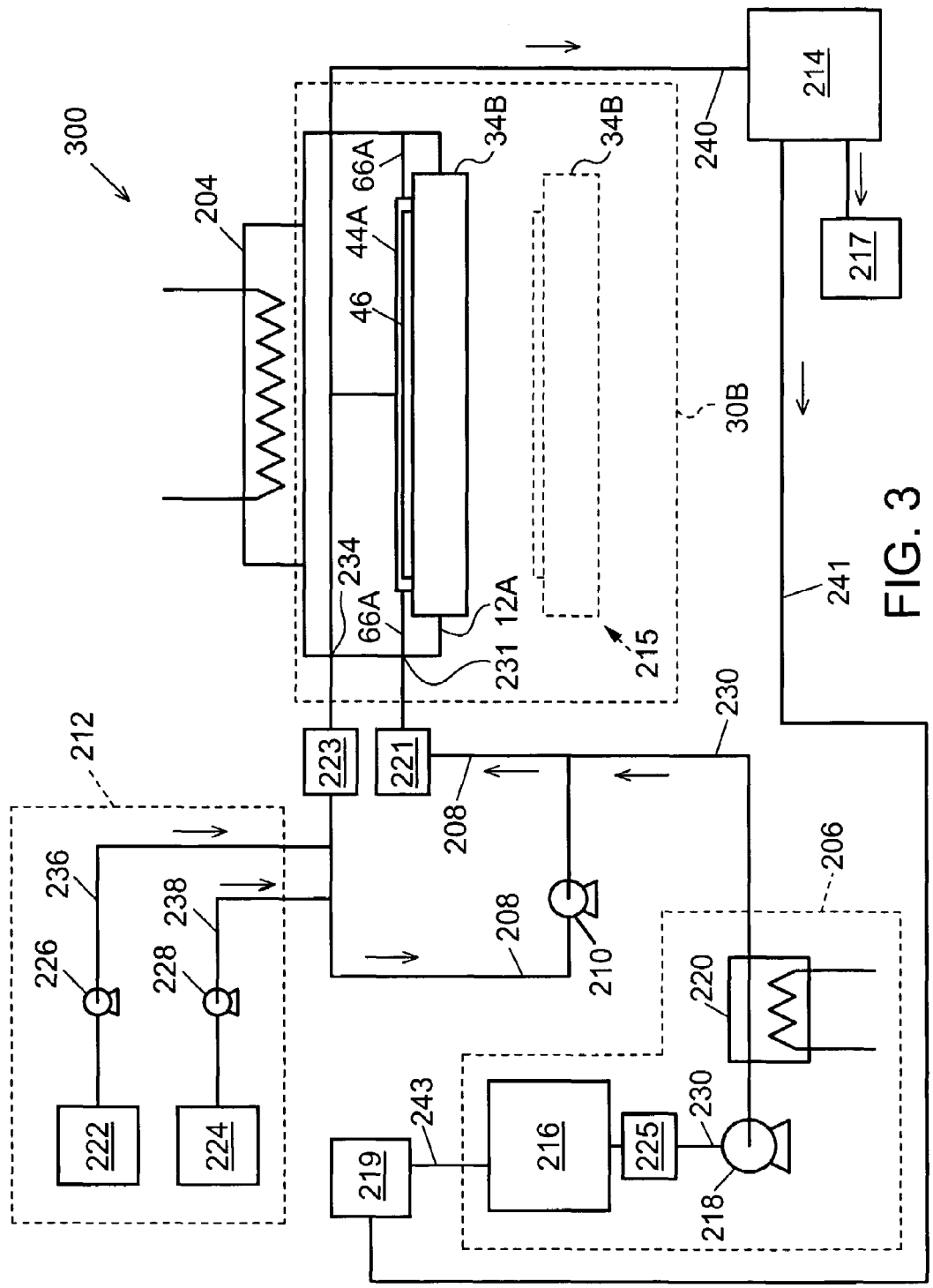
FIG. 3 shows a supercritical processing module, in accordance with the present invention.

The supercritical processing module of the present invention, in accordance with the present invention, is illustrated in FIG. 3. The supercritical processing module 300 includes the a pressure chamber 30B, a pressure chamber heater 204, a fluid supply arrangement 206, a circulation loop 208, a circulation pump 210, a developer supply arrangement 212, a separating vessel 214, a liquid/solid waste collection vessel 217, and a liquefying/purifying arrangement 219.

The pressure chamber 30B includes a chamber housing 12A and a wafer platen 34B. The pressure chamber housing 12A and the wafer platen 34B form a wafer cavity 44A for the semiconductor substrate 46. The pressure chamber housing 12A includes injection nozzles 66A. Preferably, the wafer platen 34A is held against the pressure chamber housing 12A using a hydraulic force. Alternatively, the wafer platen 34B is held against the pressure chamber housing 12A using a mechanical clamping force. Preferably, the wafer platen 34B moves to a load/unload position 215 by releasing the hydraulic force. Alternatively, the wafer platen 34B moves to the load/unload position 215 upon release of the mechanical clamping force. Further, the wafer platen 34B can move to the load/unload position 215 by actuating a drive screw coupled to the wafer platen 34B or by using a pneumatic force.

The fluid supply arrangement 206 includes a vessel 216, a pump 218, and a heater 220. The developer supply arrangement 212 includes a chemical supply vessel 222 and can includes a rinse agent supply vessel 224, and first and second high pressure injection pumps, 226 and 228.

The fluid supply vessel 216 is coupled to the pressure chamber 30B via the pump 218 and piping 230. The piping 230 includes the heater 220 located between the pump 218 and the pressure chamber 30B. The pressure chamber heater 204 is coupled to the pressure chamber 30B. The circulation pump 210 is located on the circulation loop 208. The circulation loop 208 couples to the pressure chamber 30B at a circulation inlet 232 and at a circulation outlet 234. The chemical supply vessel 222 is coupled to the circulation loop 208 via a chemical supply line 236. The rinse agent supply vessel 224 is coupled to the circulation loop 208 via a rinse agent supply line 238. The separating vessel 214 is coupled to the pressure chamber 30B via exhaust gas piping 240. The liquid/solid waste collection vessel 217 is coupled to the separating vessel 214.

The separating vessel 214 is preferably coupled to the liquefying/purifying arrangement 219 via return gas piping 241. The liquefying/purifying arrangement 219 is preferably coupled to the fluid supply vessel 216 via piping 243. Alternatively, an off-site location houses the liquefying/purifying arrangement 219, which receives exhaust gas in gas collection vessels and returns a liquid, such as sulfur hexa-fluoride in liquid sulfur hexa-fluoride vessels.

The pressure chamber heater 204 heats the pressure chamber 30B. Preferably, the pressure chamber heater 204 is a heating blanket. Alternatively, the pressure chamber heater is some other type of heater.

Preferably, first and second filters, 221 and 223, are coupled to the circulation loop 208. Preferably, the first filter 221 comprises a fine filter. More preferably, the first filter 221 comprises the fine filter configured to filter 0.05 µm and larger particles. Preferably, the second filter 223 comprises a coarse filter. More preferably, the second filter 223 comprises the coarse filter configured to filter 2–3 µm and larger particles. Preferably, a third filter 225 couples the fluid supply vessel 216 to the pump 218. Preferably, the third filter 225 comprises the fine filter. More preferably, the third filter 225 comprises the fine filter configured to filter the 0.05 µm and larger particles.

It will be readily apparent to one skilled in the art that the supercritical processing module 300 includes valving, control electronics, and utility hookups which are typical of supercritical fluid processing systems. Further, it will be readily apparent to one skilled in the art that the alternative injection nozzles 66A could be configured as part of the wafer platen 34B rather than as part of the alternative chamber housing 12A.

In operation, the supercritical processing module is preferably used for developing a photoresist residue on a semiconductor wafer 46. A photoresist developing process employing the supercritical processing module 300 comprises a loading step, a developing step, a venting step and an unloading step, as described above.

In the loading step, the semiconductor wafer 46 is placed on the wafer platen 34B and the wafer platen 34B is moved against the chamber housing 12A sealing the wafer platen 34B to the chamber housing 12A and, thus, forming a wafer cavity 44A.

In the developing step, the wafer cavity 44A is pressurized by the pump 218 with a developer fluid to desired developing conditions. The first injection pump 226 pumps a developer from chemical supply vessel 222 into the wafer cavity 44A via the chemical supply line and the circulation loop 208. Upon reaching desired developing conditions, the pump 218 stops pressurizing the wafer cavity 44A. Upon reaching a desired concentration of the developer solution, the first injection pump 226 stops injecting the developer. In the third process step, the circulation pump 210 circulates the developer fluid and developer through the wafer cavity 44A and the circulation loop 208 until the photoresist on the wafer is developed. After the developing step, the wafer cavity 44A is exhausted and the semiconductor is removed from the wafer platen 34B for further processing.

Preferably, at least two processing modules of the present invention form part of a multiple workpiece Processing system, which provides simultaneous processing capability for at least two of the semiconductor wafers. The multiple workpiece processing system is taught in U.S. patent application Ser. No. 09/704,642, filed on Nov. 1, 2000, and U.S. patent application Ser. No. 09/704,641, filed Nov. 1, 2000, which are incorporated in their entirety by reference.

A pressure chamber of the present invention can comprises the a pressure chamber 34B plus a surface enhancement feature of the chamber housing 12A above the semiconductor substrate 46. The surface enhancement feature comprises a height variation from an outer diameter of the wafer cavity 44A to a center of the wafer cavity 44A in order to provide more uniform molecular speeds above the semiconductor substrate 46. Preferably, the height variation comprises a high point at the outer diameter of the wafer cavity 34B to a low point at the center of the wafer cavity 34B providing a more constricted space at the center of the wafer cavity 34B. Alternatively, the height variation comprises the high point at the outer diameter of the alternative wafer cavity 34B, the low point between the outer diameter and the center of the wafer cavity 34B, and an intermediate point at the center of the wafer cavity 34B.

It will be readily apparent to one skilled in the art that the preferred pressure chamber 30A and the pressure chamber of the present invention are also appropriate for high pressure processing that is below supercritical conditions.

While the processes and apparatuses of this invention have been described in detail for the purpose of illustration, the inventive processes and apparatuses are not to be construed as limited thereby. It will be readily apparent to those of reasonable skill in the art that various modifications to the foregoing preferred embodiments can be made without departing from the spirit and scope of the invention as defined by the appended claims.

The invention claimed is:

1. An apparatus for developing a polymeric film, the apparatus comprising:
   a. a pressure chamber including a wafer platen;
   b. means for pressurizing the pressure chamber;
   c. means for introducing a fluid into the pressure chamber;
   d. means for introducing developer chemical into the pressure chamber, wherein the means for introducing developer chemical into the pressure chamber comprises a tetra-R-ammonium hydroxide source; and
   e. means for venting the pressure chamber.

2. The apparatus of claim 1, wherein the means for introducing developer chemical into the pressure chamber comprises a circulation loop.

3. The apparatus of claim 1, wherein the means for introducing developer chemical into the pressure chamber comprises one or more injection ports.

4. The apparatus of claim 3, wherein the means for introducing developer chemical into the pressure chamber further comprises an injection pump.

5. The apparatus of claim 1, wherein the tetra-R-ammonium hydroxide source includes an aromatic organic R-group, an aliphatic R-groups, or a combination thereof.

6. The apparatus of claim 1, wherein the pressure chamber is formed from a pressure chamber housing and the wafer platen.

7. The apparatus of claim 1, wherein the means for introducing developer chemical into the pressure chamber comprises a sulfur hexa-fluoride supply vessel.

8. The apparatus of claim 7, wherein the means for introducing developer fluid into the pressure chamber further comprises a pump and a heater coupled to the sulfur hexa-fluoride supply vessel.

9. The apparatus of claim 1, further comprising a heater for heating a wafer on the wafer platen.

10. The apparatus of claim 1, further comprising means for positioning a wafer on the wafer platen.

11. An apparatus comprising:
    a. a wafer cavity;
    b. means for generating a supercritcial fluid in the wafer cavity;
    c. means for introducing developer into the wafer cavity, wherein the means for introducing developer comprises an inert gas and tetra-R-ammonium hydroxide; and
    d. means for recirculating supercritcial fluid and developer through the wafer cavity.

12. The apparatus of claim 11, wherein the means for recirculating supercritcial fluid and developer through the wafer cavity comprises a circulation loop.

13. The apparatus of claim 12, wherein the means for recirculating supercritcial fluid and developer through the wafer cavity further comprise a circulating pump.

14. The apparatus of claim 12, wherein the means for introducing developer into the wafer cavity comprises one or more injection nozzles coupled to a developer source.

15. The apparatus of claim 11, wherein the tetra-R-ammonium hydroxide source includes one or more R-groups selected from the group consisting of an aromatic organic R-group, an aliphatic R-group, and a combination thereof.

16. The apparatus of claim 11, wherein the inert gas includes sulfur hexa-fluoride.

17. The apparatus of claim 11, wherein the wafer cavity is formed from a pressure chamber housing and a wafer platen.

18. The apparatus of claim 17, further comprising means for positioning a wafer on the wafer platen.

19. The apparatus of claim 14, wherein the means for generating a supercritical fluid in the wafer cavity comprises a pump and a heater coupled to the developer source.

20. The apparatus of claim 11, further comprising means for heating a wafer in the wafer cavity.

21. An apparatus for developing photoresist on a wafer, the apparatus comprising:
  a. a pressure chamber housing and the wafer platen that form a high pressure wafer cavity;
  b. a circulation loop and pump coupled to the high pressure wafer cavity for circulating fluid and developer through the high pressure wafer cavity;
  c. a developer source comprising a developer and an injection port for introducing the developer into one or more of the high pressure wafer cavity and the circulation loop, wherein the developer source comprises tetra-R-ammonium hydroxide and wherein R includes an R-group selected from the group consisting of an aromatic organic R-group, an aliphatic R-group and a combination thereof; and
  c. means for positioning the wafer on the wafer platen.

22. An apparatus for developing a polymeric film, the apparatus comprising:
  a. a pressure chamber including a wafer platen;
  b. means for pressurizing the pressure chamber;
  c. means for introducing a fluid into the pressure chamber;
  d. means for introducing developer chemical into the pressure chamber, wherein the means for introducing developer fluid into the pressure chamber comprises a sulfur hexa-fluoride supply vessel; and
  e. means for venting the pressure chamber.

* * * * *

UNITED STATES PATENT AND TRADEMARK OFFICE
CERTIFICATE OF CORRECTION

| | |
|---|---|
| PATENT NO. | : 7,044,662 B2 |
| APPLICATION NO. | : 10/911085 |
| DATED | : May 16, 2006 |
| INVENTOR(S) | : Chantal J. Arena-Foster et al. |

It is certified that error appears in the above-identified patent and that said Letters Patent is hereby corrected as shown below:

On Title Page Col. 2 Item (56)
IN THE REFERENCES CITED

In the U.S. Patent Documents, "US 6,001,133, 12/1999, DeYoung et al." should be added.

In the U.S. Patent Documents, "US 6,486,282, 11/2002, Dammel et al." should be added.

On Title Page 5, Item (56)
IN THE REFERENCES CITED

In the OTHER PUBLICATIONS, "US 6,001,133, 12/1999, DeYoung et al. (withdrawn)" should be deleted.

In the OTHER PUBLICATIONS, "US 6,486,282, 11/2002, Dammel et al. (withdrawn)" should be deleted.

Signed and Sealed this

First Day of August, 2006

JON W. DUDAS
*Director of the United States Patent and Trademark Office*